(12) United States Patent
Cao et al.

(10) Patent No.: US 8,614,136 B1
(45) Date of Patent: Dec. 24, 2013

(54) TECHNIQUES FOR FABRICATING JANUS MEMS TRANSISTORS

(71) Applicant: International Business Machines Corporation, Armonk, NY (US)

(72) Inventors: Qing Cao, Yorktown Heights, NY (US); Zhengwen Li, Danbury, CT (US); Fei Liu, Yorktown Heights, NY (US); Zhen Zhang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/665,334

(22) Filed: Oct. 31, 2012

(51) Int. Cl.
*H01L 21/76* (2006.01)
*H01L 29/06* (2006.01)

(52) U.S. Cl.
USPC ............................ 438/409; 257/27; 257/14

(58) Field of Classification Search
USPC ............. 257/14, 27; 438/408, 409, 441, 800, 438/900
See application file for complete search history.

(56) References Cited

U.S. PATENT DOCUMENTS

| | | |
|---|---|---|
| 6,984,842 B1 | 1/2006 | Nayfeh et al. |
| 7,767,017 B2 | 8/2010 | Lahann et al. |
| 7,851,294 B1 | 12/2010 | Basco et al. |
| 2008/0043317 A1 | 2/2008 | Hsu et al. |

OTHER PUBLICATIONS

Lattuada et al., "Synthesis, properties and applications of Janus nanoparticles," nanotoday, vol. 6, Issue 3, Jun. 2011, pp. 286-308.
Roh et al., "Biphasic Janus particles with nanoscale anisotropy," Nature Materials, vol. 4 (Oct. 2005).
Perro et al., "Design and synthesis of Janus micro- and nanoparticles," J. Mater. Chem., 15, 3745-3760 (Jul. 2005).
S. Jiang et al., "Janus Particle Synthesis and Assembly," Adv. Mater., vol. 22, 2010, pp. 1060-1071.
A. B. Pawar et al., "Self-Assembly of T-Structures in Molecular Fluids," J. Phys. Chem. B, vol. 111, No. 8, Feb. 2007, pp. 2081-2089.
U. Hilleringmann et al., "Semiconductor nanoparticles for electronic device integration on foils," IEEE AFRICON 2011, Sep. 13-15, 2011.
T. Honegger et al., "4-d dielectrophoretic handling of Janus particles in a micro uidic chip," Microelectron. Eng., vol. 87, 2010, pp. 756-759.

*Primary Examiner* — Andy Huynh
*Assistant Examiner* — Juanita B Rhodes
(74) *Attorney, Agent, or Firm* — Louis J. Percello; Michael J. Chang, LLC

(57) ABSTRACT

Electromechanical transistors that employ Janus micro/nano-components and techniques for the fabrication thereof are provided. In one aspect, a method of fabricating an electromechanical transistor includes the following steps. A wafer is provided. A source electrode and a drain electrode are formed opposite one another on a surface of the wafer, wherein a gap is present between the source electrode and the drain electrode. A first gate electrode and a second gate electrode are formed on the surface of the wafer on opposite sides of the gap between the source electrode and the drain electrode. At least one Janus component is placed in the gap between the source electrode and the drain electrode, wherein the Janus component includes a first portion having an electrically conductive material and a second portion having an electrically insulating material.

22 Claims, 8 Drawing Sheets

*FIG. 1D*
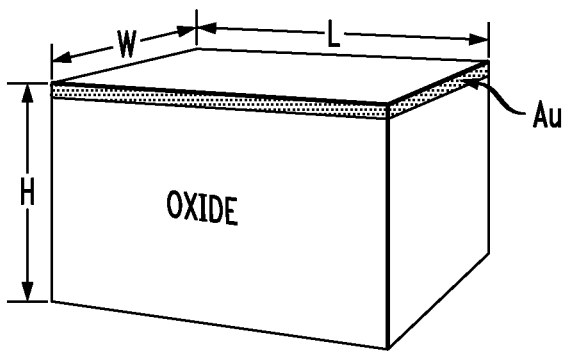
*FIG. 2A*      *FIG. 2B*
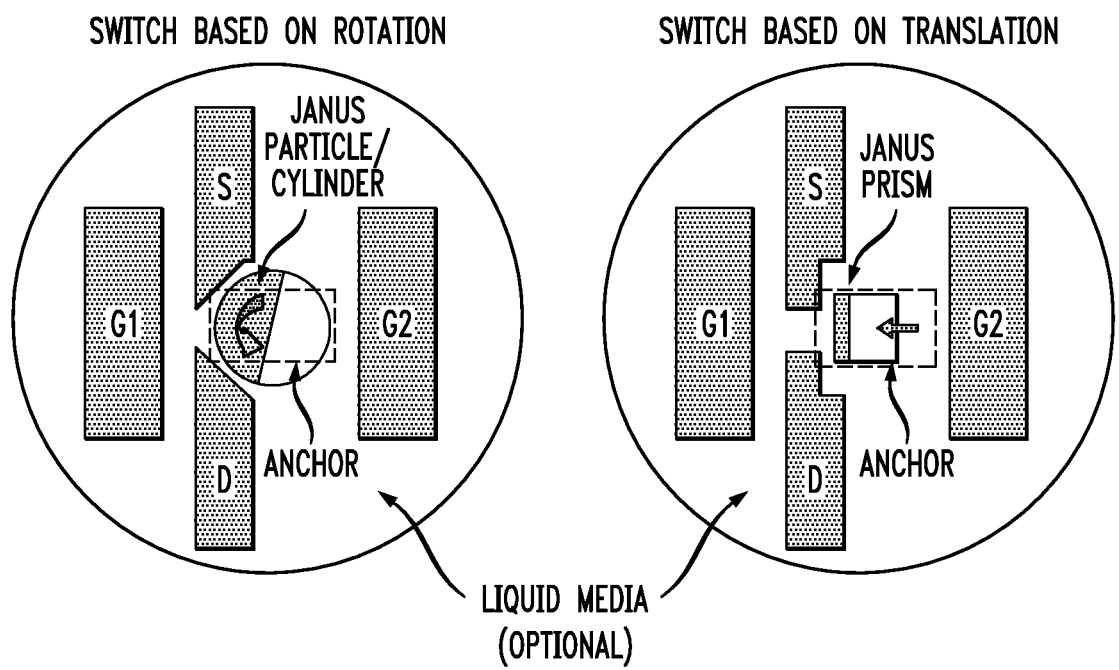

FIG. 14
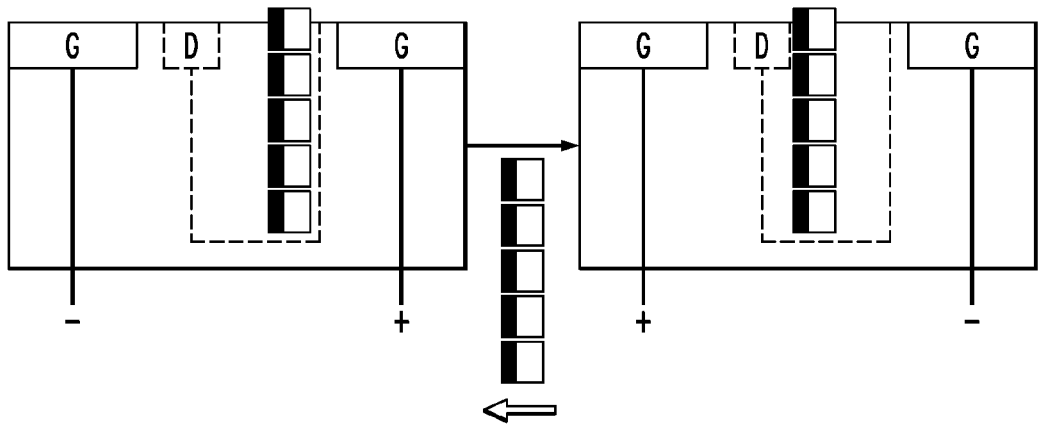
FIG. 15
ON DIELECTRIC
NEGATIVE CHARGE: PYRIDINE
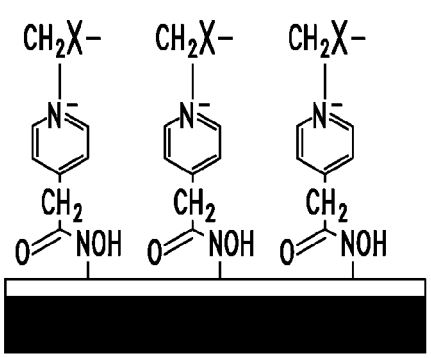
POSITIVE CHARGE: DIAZONIUM
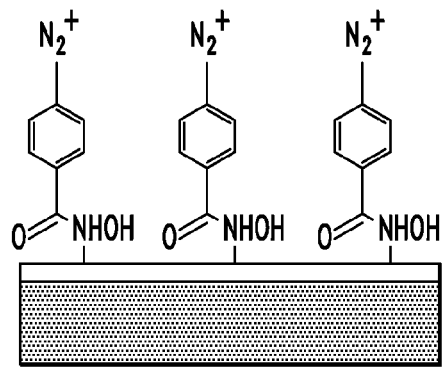
ON METAL
SAME CHARGED FUNCTIONAL GROUP, BUT USING THIOL (-SH) GROUP INSTEAD OF HYDROXAMIC GROUP TO ANCHOR THE MOLECULE ON METAL SURFACE
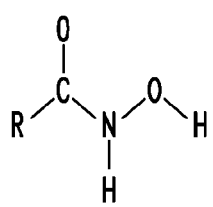

TECHNIQUES FOR FABRICATING JANUS MEMS TRANSISTORS

FIELD OF THE INVENTION

The present invention relates to electromechanical transistors, and more particularly, to electromechanical transistors that employ Janus micro/nano-components (e.g., Janus particles, cylinders, prisms, etc.) and techniques for the fabrication thereof.

BACKGROUND OF THE INVENTION

The use of microelectromechanical systems (MEMS) and nanoelectromechanical systems (NEMS) as switches in memory applications has recently drawn a lot of attention for their favorable properties. For instance, because they are mechanical, electromechanical switches can reduce standby leakage current. Electromechanical switches also potentially have better sub-threshold behavior than transistors (which are limited by 60 mV/dec.).

However, conventional electromechanical switch designs require a large control gate voltage which makes them hard to scale. The reliability of conventional electromechanical switches can also be an issue. Reliability refers to a lifetime of the electromechanical switch, for example how many times the electromechanical transistor can be switched on and off, how long the electromechanical transistor can stay on with resistance less than a certain value, etc.

Therefore, an improved electromechanical switch design that does not suffer from the above-described drawbacks would be desirable.

SUMMARY OF THE INVENTION

The present invention provides electromechanical transistors that employ Janus micro/nano-components and techniques for the fabrication thereof. In one aspect of the invention, a method of fabricating an electromechanical transistor is provided. The method includes the following steps. A wafer is provided. A source electrode and a drain electrode are formed opposite one another on a surface of the wafer, wherein a gap is present between the source electrode and the drain electrode. A first gate electrode and a second gate electrode are formed on the surface of the wafer on opposite sides of the gap between the source electrode and the drain electrode. At least one Janus component is placed in the gap between the source electrode and the drain electrode, wherein the Janus component includes a first portion having an electrically conductive material and a second portion having an electrically insulating material.

In another aspect of the invention, a method of operating an electromechanical transistor is provided. The method includes the following steps. The electromechanical transistor is provided having 1) a source electrode and a drain electrode opposite one another on a surface of a wafer, wherein a gap is present between the source electrode and the drain electrode; 2) a first gate electrode and a second gate electrode on the surface of the wafer on opposite sides of the gap between the source electrode and the drain electrode; and 3) at least one Janus component positioned in the gap between the source electrode and the drain electrode, wherein the Janus component includes a first portion having an electrically conductive material and a second portion having an electrically insulating material. A gate bias is applied to the first gate electrode and the second gate electrode to move the Janus component so as to position the first portion of the Janus component having the electrically conductive material between the source electrode and the drain electrode which acts as a bridge between the source electrode and the drain electrode.

In yet another aspect of the invention, an electromechanical transistor is provided. The electromechanical transistor includes a source electrode and a drain electrode opposite one another on a surface of a wafer, wherein a gap is present between the source electrode and the drain electrode; a first gate electrode and a second gate electrode on the surface of the wafer on opposite sides of the gap between the source electrode and the drain electrode; and at least one Janus component positioned in the gap between the source electrode and the drain electrode, wherein the Janus component includes a first portion having an electrically conductive material and a second portion having an electrically insulating material.

A more complete understanding of the present invention, as well as further features and advantages of the present invention, will be obtained by reference to the following detailed description and drawings.

BRIEF DESCRIPTION OF THE DRAWINGS

FIG. 1D is a three-dimensional diagram illustrating an exemplary Janus prism which may be used in accordance with the present techniques according to an embodiment of the present invention;

FIG. 2A is a diagram illustrating an exemplary configuration of the present transistor device having a Janus particle, wherein the transistor is switched by rotating the Janus particle according to an embodiment of the present invention;

FIG. 2B is a diagram illustrating an exemplary configuration of the present transistor device having a Janus prism, wherein the transistor is switched by moving/translating the Janus prism according to an embodiment of the present invention;

FIG. 14 is a diagram illustrating operation of the present Janus component based transistor device when multiple Janus prisms (such as that shown in FIG. 1D) are employed according to an embodiment of the present invention; and FIG. 15 is a diagram illustrating exemplary chemistry for functionalization of the present metal and dielectric surfaces according to an embodiment of the present invention.

DETAILED DESCRIPTION OF PREFERRED EMBODIMENTS

Figure 1A:
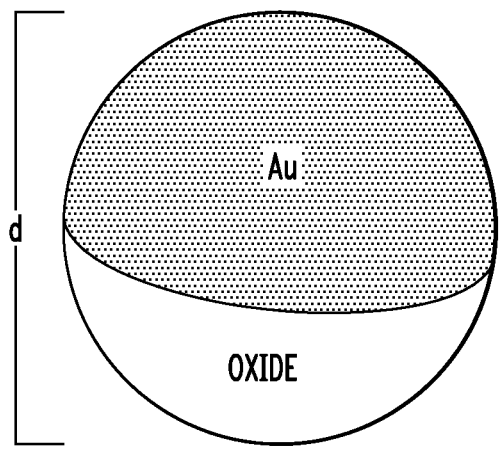
FIG. 1A is a three-dimensional diagram illustrating an exemplary Janus particle which may be used in accordance with the present techniques according to an embodiment of the present invention.

Provided herein are electromechanical transistors that employ Janus micro/nano-components (e.g., Janus particles, cylinders, prisms, etc.—see below) and techniques for the fabrication thereof. In general, a Janus micro/nano-component is a particle, cylinder, prism, etc. the surface of which has two (or more) distinct physical properties. For instance, as will be described in detail below, the Janus micro/nano-component could be composed of two different materials.

As will be described in detail below, the use of Janus micro/nano-components in an electromechanical transistor has several notable benefits: 1) Janus micro/nano-components-based electromechanical transistors have a scalable geometry to reduce voltage, 2) Janus micro/nano-components-based electromechanical transistors exhibit better reliability than conventional electromechanical transistors, 3) Janus micro/nano-components-based electromechanical transistors can be fabricated at a lower cost than conventional electromechanical transistors, 4) Janus micro/nano-components-based electromechanical transistors have applicability to bio-medical applications (e.g., bioswitches). As provided above, reliability refers to a lifetime of the electromechanical switch. Traditional electromechanical transistors are cantilever based and thus require cantilever contact to the electrodes to turn on and off. As will be described below, the present techniques involve rotation or translation of a Janus component to turn the device on or off. This movement (rotation/translation) of the Janus component provides more reliable operation over a longer lifetime than with traditional cantilever designs.

FIGS. 1A-D are three-dimensional diagrams illustrating exemplary Janus micro/nano-components that may be used in accordance with the present techniques. There are currently three methods known for fabricating Janus particles, cylinders, prisms, etc. See for example Lattuada et al., "Synthesis, properties and applications of Janus nanoparticles," nanotoday, vol. 6, Issue 3, June 2011, pages 286-308 (hereinafter "Lattuada"), the contents of which are incorporated by reference herein. For instance as described in Lattuada, one method for fabricating Janus particles is via self-assembly of block copolymers, and mixtures of ligands on the surfaces of the nanoparticles. Another method for fabricating Janus particles is through a masking step in which particles are trapped at the interface between two phases, so that a modification to the particle surface is made only on one side. Yet another method for fabricating Janus particles relies on the phase separation of two different substances, usually either two polymers, or a polymer and an inorganic material.

According to an exemplary embodiment, the Janus micro/nano-components used in accordance with the present techniques include a first portion made of a first material which is an electrically conducting material, such as a metal(s), and a second portion made of a second material which is an electrically insulating material, such as a dielectric material (e.g., an oxide or nitride dielectric material). See for example FIG. 1A which depicts an exemplary Janus particle which may be used in accordance with the present techniques. The Janus particle shown in FIG. 1A has one hemisphere composed of a metal (in this case gold (Au)) and a second hemisphere composed of a dielectric material (in this case an oxide dielectric material). Thus one portion of the particle is electrically conductive and another portion is not electrically conductive. Gold (Au) is an appropriate metal for use in the present Janus components since it is relatively abundant and is biocompatible, however other metals may be employed. By way of example only, suitable metals for use as the electrically conductive portion in the present Janus components include, but are not limited to, gold (Au), copper (Cu), aluminum (Al), silver (Ag), and palladium (Pd).

As highlighted above, the geometries of the Janus micro/nano-components (also referred to herein generally as "Janus components") are scalable. In the case of a Janus particle like that shown in FIG. 1A, the dimensions of the particle may be measured based on the diameter d of the particle. By way of example only, the Janus particle may have a diameter d of from about 20 nanometers (nm) to about 20 micrometers (µm). Further, when the Janus particle has a diameter d of from about 100 nanometers (nm) to about 20 micrometers (µm) it is considered herein to be a Janus microcomponent and when the Janus particle has a diameter d of from about 20 nm to about 100 nm it is considered herein to be a Janus nanocomponent.

Figure 1B:
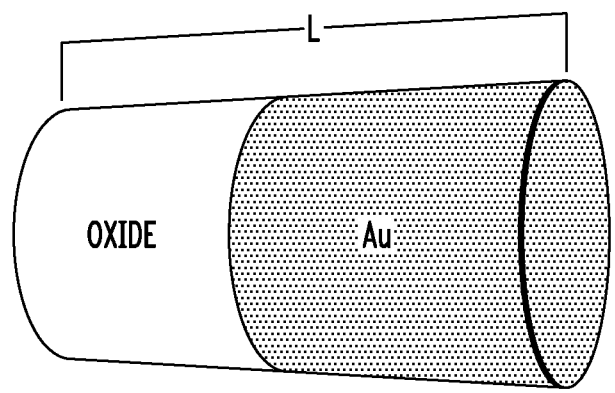
FIG. 1B is a three-dimensional diagram illustrating an exemplary Janus cylinder which may be used in accordance with the present techniques according to an embodiment of the present invention.

FIG. 1B is a diagram which depicts an exemplary Janus cylinder which may be used in accordance with the present techniques. The Janus cylinder shown in FIG. 1B is composed of a metal (in this case Au) along one portion of its length and a dielectric material (in this case an oxide dielectric) along another portion of its length. Thus one portion of the cylinder is electrically conductive and another portion is not electrically conductive. As provided above, in addition to Au, other suitable metals for forming the electrically conductive portion of the Janus component include, but are not limited to, Cu, Al, Ag, and Pd.

The dimensions of the Janus cylinder shown in FIG. 1B may be measured based on the length L of the cylinder. By way of example only, the Janus cylinder may have a length L of from about 20 nm to about 100 μm. Further, when the Janus cylinder has a length L of from about 100 nm to about 100 μm it is considered herein to be a Janus microcomponent and when the Janus cylinder has a length L of from about 20 nm to about 100 nm it is considered herein to be a Janus nanocomponent.

Figure 1C:
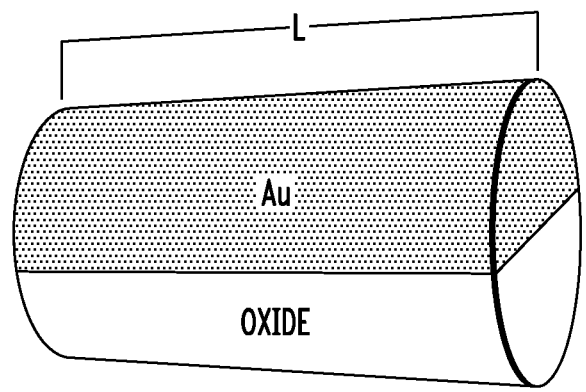
FIG. 1C is a three-dimensional diagram illustrating another exemplary Janus cylinder which may be used in accordance with the present techniques according to an embodiment of the present invention.

FIG. 1C is a diagram which depicts another exemplary Janus cylinder which may be used in accordance with the present techniques. By comparison with the Janus cylinder shown in FIG. 1B, this Janus cylinder is composed of a metal (in this case Au) along (the entire length of) one side of the cylinder and a dielectric material (in this case an oxide dielectric material) along (the entire length of) another side of the cylinder. Thus one side of the cylinder is electrically conductive and another side is not electrically conductive. Exemplary Janus cylinder dimensions were provided above. Gold (Au) is being used here merely as an example. As provided above, in addition to Au, other suitable metals for forming the electrically conductive portion of the Janus component include, but are not limited to, Cu, Al, Ag, and Pd.

FIG. 1D is a diagram which depicts an exemplary Janus prism which may be used in accordance with the present techniques. The Janus prism shown in FIG. 1D has one portion composed of a metal (in this case Au) and a second portion composed of a dielectric material (in this case an oxide dielectric material). Thus one portion of the prism is electrically conductive and another portion is not electrically conductive. FIG. 1D also illustrates that the conductive and non-conductive portions of the Janus component do not have to be the same size. For instance in the examples shown in FIGS. 1A-C, the metal and oxide portions are shown to be the same size as one another. In the examples shown in FIG. 1D, the metal portion makes up only one side of the prism while the remainder of the prism is the oxide. Again, gold (Au) is being used here merely as an example. As provided above, in addition to Au, other suitable metals for forming the electrically conductive portion of the Janus component include, but are not limited to, Cu, Al, Ag, and Pd.

The dimensions of the Janus prism shown in FIG. 1D may be measured based on the length L, width W and height H of the prism. By way of example only, the Janus prism may have a length L, width W and height H each of from about 20 nm to about 20 μm. Further, when the Janus prism has a length L, width W, and height H each of from about 100 nm to about 20 μm it is considered herein to be a Janus microcomponent and when the Janus prism has a length L, width W, and height H each of from about 20 nm to about 100 nm it is considered herein to be a Janus nanocomponent.

According to the present techniques, a fixed charge is created on the surface of the metal portion of the Janus components. Optionally, a fixed charge may also be created on the surface of the dielectric portion of the Janus components, which is of an opposite polarity from the fixed charge created on the surface of the metal portion (i.e., a fixed negative charge is created on the metal portion and a fixed positive charge is created on the surface of the dielectric portion of the Janus particles, or vice-a-versa). As will be described in detail below, this fixed charge (or fixed charges) permit the Janus components to be actuated (e.g., turned/moved) during operation of the transistor device in response to an applied gate electrical field. According to one exemplary embodiment, the fixed charge created on the surface of the metal portion of the Janus components is a negative fixed charge. By way of example only, a self-assembled monolayer containing a thiol compound with negatively charged functional groups (pyridine and carboxyl, e.g., SH—R—COO—) may be used to create this fixed negative charge on the metal portion of the Janus components. Thiols have an affinity for noble metals, and thus will self-assemble as a monolayer on the surface of the metal portion of the Janus components. As highlighted above, an optional fixed charge of an opposite polarity (in this case a fixed positive charge) can be created on the surface of the dielectric portion of the Janus components. To create a fixed positive charge on the surface of the dielectric portion of the Janus components a self-assembled monolayer containing a hydroxamic compound with positively charged functional groups (e.g., diazonium) may be used. As will be described in conjunction with the description of FIG. 15, below, the same (positively or negatively) charged functional groups may be employed but a thiol group is preferable for anchoring the molecules to a metal surface (such as the metal portion of the Janus components, the source and drain electrodes, etc.) whereas a hydroxamic group is preferred for anchoring the molecules to a dielectric (e.g., oxide or nitride) surface.

Selective modification of a Janus component is described for example in Roh et al., "Biphasic Janus particles with nanoscale anisotropy," Nature Materials, vol. 4 (October 2005) (which describes, for example, biphasic jetting) and in Perro et al., "Design and synthesis of Janus micro- and nanoparticles," J. Mater. Chem., 15, 3745-3760 (2005) (which describes for example surface modification of partially-masked particles), the contents of each of which is incorporated by reference herein. In the same manner as described above a fixed negative charge can be created on the surface of the metal portion and a fixed negative charge can be created on the surface of the dielectric portion. Alternatively, in another exemplary embodiment, the opposite scenario is employed, namely that where a fixed positive charge is created on the surface of the metal portion of the Janus components. As described above, in order to create a fixed positive charge, a self-assembled monolayer containing a thiol compound with positively charged functional groups (e.g., diazonium) may be used. An optional fixed charge of an opposite polarity (in this case a fixed negative charge) can be created on the surface of the dielectric portion of the Janus components as described above. Exemplary chemistry for functionalizing a dielectric and a metal surface is described in conjunction with the description of FIG. 15, below.

An overview of the present Janus component-based transistors is now provided by way of reference to FIGS. 2A and 2B. The layout and switching operation of the transistors will depend on the particular type of Janus component being employed in the transistor. Namely, when a spherical Janus component (a Janus particle) is used then switching will occur by using an applied gate electrical field to rotate the Janus component to place the metal portion of the Janus component between the source and drain contacts of the device. By comparison, when a prism-shaped Janus component is used, then switching will occur by using an applied gate electrical field to translate (i.e., transfer from one place to another) the Janus component such that the metal portion of the Janus component is placed between the source and drain contacts of the device. See FIGS. 2A and 2B. When a cylindrical Janus component like in FIGS. 1B and 1C is used, switching can occur by either rotation or translation of the Janus component, depending on the specific configuration of the Janus component. By way of example only, when the Janus component is a cylinder configured as shown in FIG. 1B, then switching will occur by using an applied gate electrical field to translate (i.e., transfer from one place to another)

the Janus component such that the metal portion of the Janus component is placed between the source and drain contacts of the device. By comparison, when the Janus component is a cylinder configured as shown in FIG. 1C, then switching will occur by using an applied gate electrical field to rotate the Janus component to place the metal portion of the Janus component between the source and drain contacts of the device. The switching of Janus particle-, prism-, and cylinder-based transistors is shown illustrated in FIGS. 7-10, respectively, as described below.

As shown in FIG. 2A, the transistor includes a source electrode, a drain electrode, and at least one Janus component positioned between the source and drain electrodes. In this case, the Janus component is a single, spherical Janus particle. As will be described below, embodiments are provided herein where multiple Janus components, rather than a single component, are employed. However, the use of multiple components or a single component is functionally the same. An anchoring trench is present beneath the Janus component to keep the Janus component in position relative to the source and drain contacts. A first gate electrode and a second gate electrode are positioned at opposite ends of the anchoring trench such that the Janus component is present between the (first and second) gate electrodes.

When a gate electrical field is applied to the device via the (first and second) gate electrodes, the Janus component will rotate and/or translate due to the fixed negative charge on the surface of the metal portion of the Janus component (see above). When this rotation of the Janus component occurs, the metal portion of the component will be positioned between the source and drain electrodes forming a bridge and electrical contact between the source and drain electrodes. As will be described in conjunction with the description of FIGS. 7-9 below, when the gate electrical field is removed from the device, the orientation of the Janus component will remain the same. Namely, a gate bias in the opposite direction is needed to switch the device back. Therefore, the present devices can serve as non-volatile memory cells. As shown in FIG. 2A, an optional (insulating) liquid medium coating can be present over/surrounding the transistor. Such 'liquid packaging' acts as an insulator and prevents arcing between the electrodes. Suitable liquid media include, but are not limited to, an oil-based media (such as a commercially available highly refined transformer oil that is free of water vapor) and an insulating liquid.

The scenario involving a Janus prism is shown in FIG. 2B. As above, the transistor includes a source contact, a drain contact, and at least one Janus component positioned between the source and drain contacts. An anchoring trench is present beneath the Janus component to keep the Janus component in position relative to the source and drain contacts. A first gate electrode and a second gate electrode are positioned at opposite ends of the anchoring trench such that the Janus component is present between the (first and second) gate electrodes.

When a gate electrical field is applied to the device via the (first and second) gate electrodes, translation of the Janus component will occur due to the fixed negative charge on the surface of the metal portion of the Janus component (see above). When this translation of the Janus component occurs, the metal portion of the component will be moved into position between the source and drain electrodes forming a bridge and making electrical contact between the source and drain electrodes. As shown in FIG. 2B, an optional (insulating) liquid medium coating can be present over/surrounding the transistor to act as an insulator and to prevent arcing between the electrodes.

While FIGS. 2A and 2B illustrate the use of a single Janus component in the transistor this is merely one possible configuration. For instance, the transistor may include multiple Janus components which function in the same manner as described above. Namely, when a gate electrical field is applied to the device via the (first and second) gate electrodes, the multiple Janus components will rotate and/or translate in unison such that the metal portion of each of the Janus components will be moved into position between the source and drain electrodes forming a bridge and making electrical contact between the source and drain electrodes in the same manner as described above. Exemplary device configurations employing multiple Janus components are shown illustrated in FIGS. 11-14, described below.

An exemplary process flow for fabricating the present Janus component-based transistors will now be described by way of reference to FIGS. 3-6. The example provided is that involving a (spherical) Janus particle—i.e., so as to produce the device shown in FIG. 2A. However the same process steps would be carried out for any of the other Janus component shapes described herein.

Figure 3:
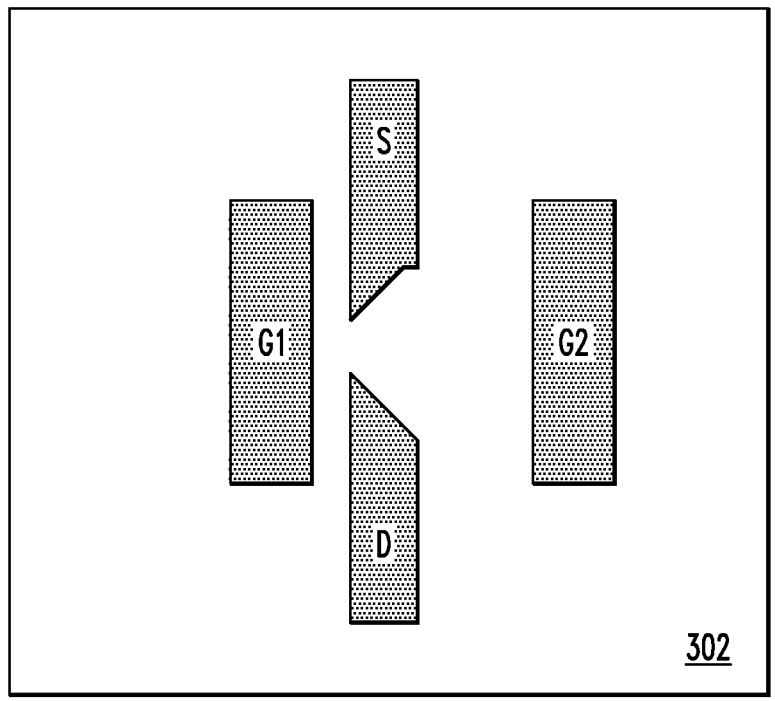
FIG. 3 is a diagram illustrating a starting structure for fabricating the present Janus component-based transistor having source (S), drain (D) and gate (G1 and G2) electrodes formed on a dielectric layer according to an embodiment of the present invention.
Figure 4:
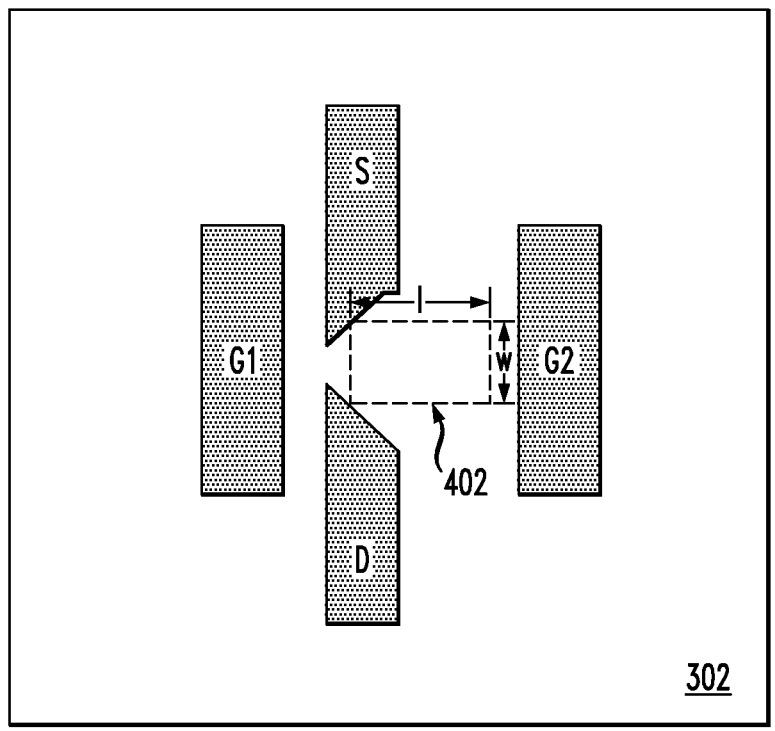
FIG. 4 is a diagram illustrating a trench for anchoring the Janus component (i.e., an anchor trench) having been formed in the dielectric layer between the gate (G1 and G2) electrodes according to an embodiment of the present invention.
Figure 5:
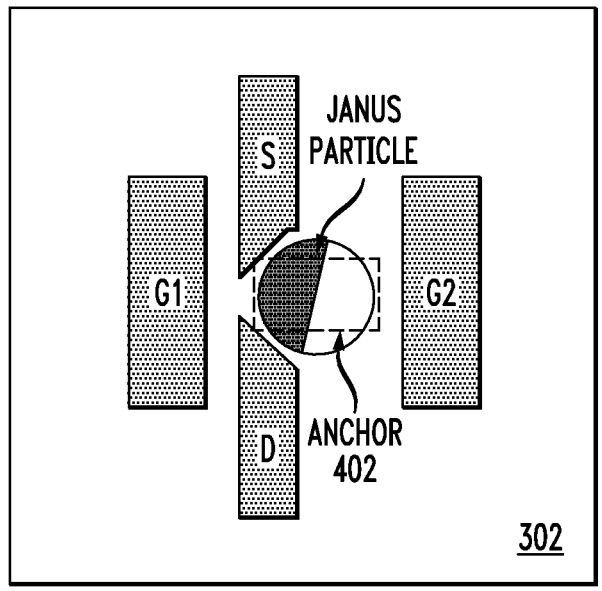
FIG. 5 is a diagram illustrating the Janus component having been transferred to the transistor according to an embodiment of the present invention.

As shown in FIG. 3, the first step in the process is to form the source, drain and gate electrodes. The starting platform for the fabrication process is a wafer having a dielectric layer 302 thereon. The source electrode (labeled "S"), the drain electrode (labeled "D"), the first gate electrode (labeled "G1") and the second gate electrode (labeled "G2") can be formed on the surface of the wafer using conventional metal plating and lift-off techniques. According to an exemplary embodiment, the source, drain and gate electrodes are formed from copper (Cu). As shown in FIG. 3, the source and drain electrodes are formed on the surface of the wafer (i.e., on the dielectric layer 302) positioned opposite one another such that a gap is present between the source and drain electrodes (it is in this gap in which the at least one Janus component will be placed). The gate electrodes are positioned opposite one another on the surface of the wafer (i.e., on the dielectric layer 302) and perpendicular to the source and drain electrodes. Namely, in the example shown, the source electrode and the drain electrode are formed opposite one another in a first direction along the surface of the wafer, and the first gate electrode and the second gate electrode are formed opposite one another in a second direction along the surface of the wafer, wherein the first direction is perpendicular to the second direction.

Next an anchor trench 402 is formed in the gap between the source and drain electrodes where the Janus component will be placed. See FIG. 4. The anchor trench 402 can be formed using a conventional reactive ion etching process on the dielectric layer. At least one Janus component will be deposited into the anchor trench 402 and the anchor trench will serve to anchor the Janus component(s) to the wafer and to maintain a positioning of the Janus component(s) relative to the source and drain electrodes. The anchor trench also has to permit the Janus component(s) to rotate/translate when the gate electrical field is applied to the device. The dimensions of the anchor trench 402 depend on the size and/or number of the Janus components employed. By way of example only, in one exemplary embodiment, the trench has a length l of from about 20 nm to about 200 μm, a width w of from about 20 nm to about 20 μm and a depth (a dimension of the trench into the page as per the orientation of the device shown in FIG. 4) of from about 10 nm to about 50 nm.

Optionally, the source and drain electrodes may be functionalized with a fixed charge to induce affinity between the source and drain electrodes and the metal portion of the Janus component(s). The fixed charge on the source and drain electrodes should be opposite to the fixed charge on the metal portion of the Janus component. Thus, in the example provided above, the surface of the metal portion of the Janus particle was functionalized with a fixed negative charge. In that case, the source and drain electrodes could be functionalized with a positive fixed charge in order to induce affinity between the source and drain electrodes. If, on the other hand, the surface of the metal portion of the Janus particle was functionalized with a positive fixed charge, then the source and drain electrodes would be functionalized with a negative fixed charge.

This step of functionalizing the source and drain electrodes with a fixed charge is optional and depends on what specific technique is used (later in the process) to place the Janus component. For instance, if the Janus component is placed using a chemical approach (e.g., soaking the device in a solution containing the Janus components), then this step of functionalizing the source and drain electrodes with a positive or negative fixed charge (in combination with the (opposite) negative or positive fixed charge on the Janus component, as well as the presence of the anchor trench) helps in securing the Janus components in the proper position on the device, and permits excess Janus particles to be removed, i.e., rinsed off. On the other hand, if a geometric approach is used to place the Janus component (e.g., if a spin-on process is used to deposit the Janus component through a mask), then the step of functionalizing the source and drain electrodes is likely not necessary.

The process for functionalizing the source and drain electrodes with a fixed charge is the same as that described above for functionalizing the Janus component. Namely, in order to create a fixed positive charge on the source and drain electrodes, a self-assembled monolayer containing a thiol compound with positively charged functional groups (e.g., diazonium) can be used. Alternatively, in order to create a fixed negative charge on the source and drain electrodes, a self-assembled monolayer containing a thiol compound with negatively charged functional groups (pyridine and carboxyl, e.g., SH—R—COO—) may be used.

Next, at least one Janus component is transferred to the transistor. See FIG. 5. As described above, prior to placing the Janus component(s) on the transistor, the surface of the metal portion of each of the Janus components is functionalized with a (positive or negative) fixed charge. The process for creating a monolayer of this fixed charge on a Janus component was described above.

As highlighted above, a couple of different techniques may be used to place at least one of the Janus components on the transistor. The first is a 'chemical' approach wherein the transistor is soaked in an aqueous solution containing the Janus components. It is assumed that multiple transistors may be fabricated on the same wafer using the present techniques. Thus the present techniques are configured to insure that 1) at least one of the Janus components is placed in the proper position (e.g., relative to the source, drain and gate electrodes) and 2) that all other Janus components can be easily removed leaving the properly positioned Janus component(s) in place. The first provision that ensures proper placement is the anchor trench which will serve to geometrically confine at least one of the deposited Janus components which fall within the trench. The second provision that ensures proper placement is that an electrical field can be applied to the gate electrodes during deposition of the Janus components, which attracts the fixed charge on the metal portion of one of the Janus components. The third provision that ensures proper placement is the optional step described above of functionalizing the surface of the source and drain electrodes with a fixed charge (opposite to that fixed on the surface of the Janus components), which in combination with the fixed charge on the metal portion of the Janus component will serve to attract one of the Janus components.

The second approach for positioning at least one Janus component on the transistor is a geometric approach, where a mask—for example a photoresist, is placed over the transistor, and patterned to permit deposition of at least one Janus component at the proper location for each of the transistors. The solution of the Janus components can then be deposited (e.g., using a spin-on process) through the mask. In that case, since the placement of the Janus components is being directed by the mask, the optional step of functionalizing the surface of the source and drain electrodes is likely not necessary since the Janus components will be deposited through the mask into the anchor trenches.

Following placement of the Janus component(s) in the transistor, the wafer may be rinsed (for example with distilled water) to remove extra deposited Janus components, and the photoresist (if present) can be removed by conventional processes. As described above, the anchor trench and/or the affinity of the Janus component for the gate electrodes and/or the affinity of the Janus components to the (functionalized) source and drain electrodes all serve to 'anchor' the at least one Janus particle in place during this rinsing step.

An optional liquid media coating may be deposited over/surrounding the transistor. See FIG. 6. As highlighted above, the liquid media coating serves as an insulator and prevents arcing between the electrodes. The liquid media coating is also referred to herein as a "liquid packaging." As provided above, suitable liquid media for forming the liquid packaging includes, but is not limited to, an oil-based media (such as a commercially available highly refined transformer oil that is free of water vapor) and an insulating liquid. Fabrication of the Janus component-based device may now be considered complete.

Figure 6:
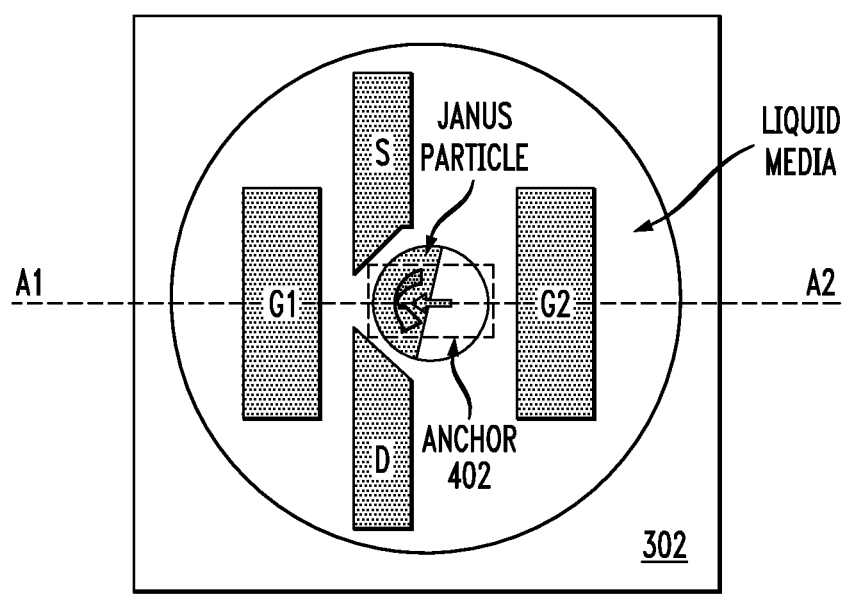
FIG. 6 is a diagram illustrating an optional liquid media coating having been deposited over the transistor according to an embodiment of the present invention.
Figure 13:
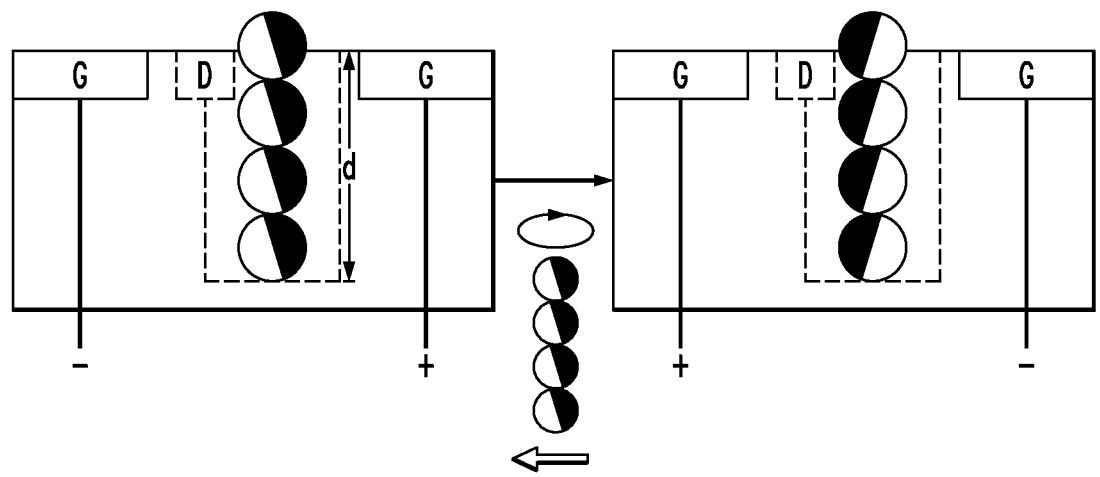
FIG. 13 is a diagram illustrating operation of the present Janus component based transistor device when multiple spherical Janus particles (such as that shown in FIG. 1A) are employed according to an embodiment of the present invention.

Exemplary multiple-component embodiments will be described below by way of reference to FIGS. 13 and 14. As will be described below, FIGS. 13 and 14 depict cross-sectional cuts through the device, i.e., through the anchor trench—for example along line A1-A2 as shown in FIG. 6.

Figure 7:
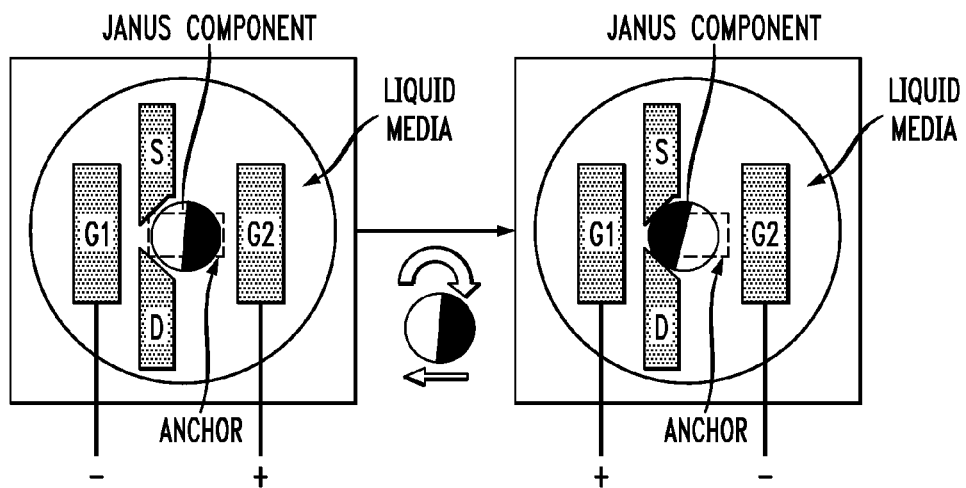
FIG. 7 is a diagram illustrating operation of the present Janus component based transistor device when the Janus component is a spherical Janus particle (such as that shown in FIG. 1A) according to an embodiment of the present invention.
Figure 8:
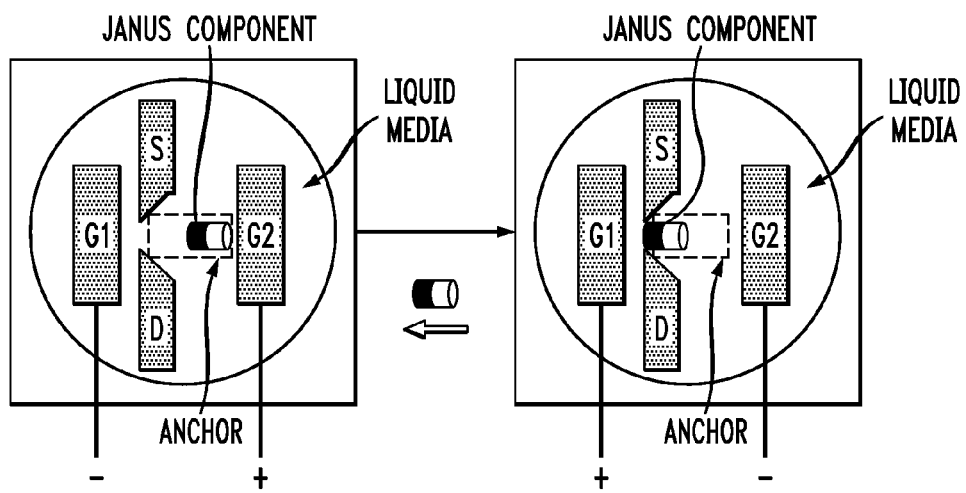
FIG. 8 is a diagram illustrating operation of the present Janus component based transistor device when the Janus component is a Janus cylinder (such as that shown in FIG. 1B) according to an embodiment of the present invention.
Figure 9:
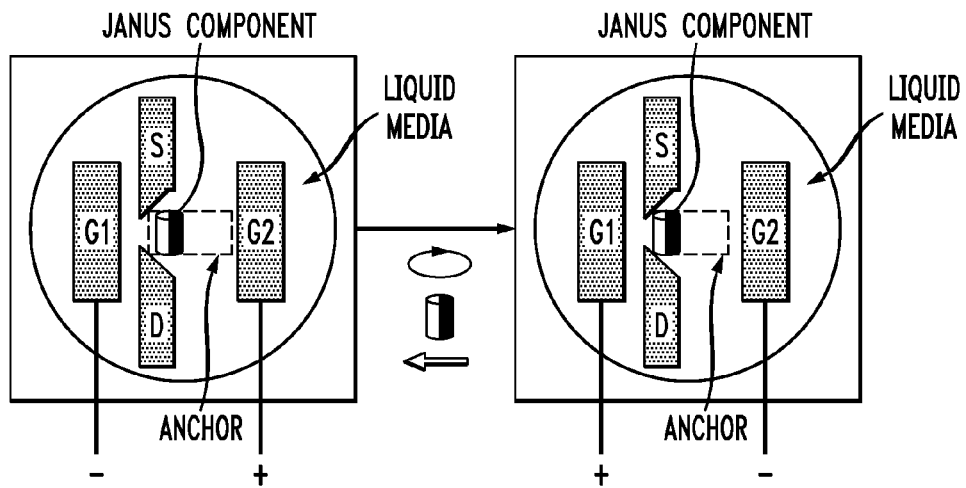
FIG. 9 is a diagram illustrating operation of the present Janus component based transistor device when the Janus component is a Janus cylinder (such as that shown in FIG. 1C) according to an embodiment of the present invention.
Figure 11:
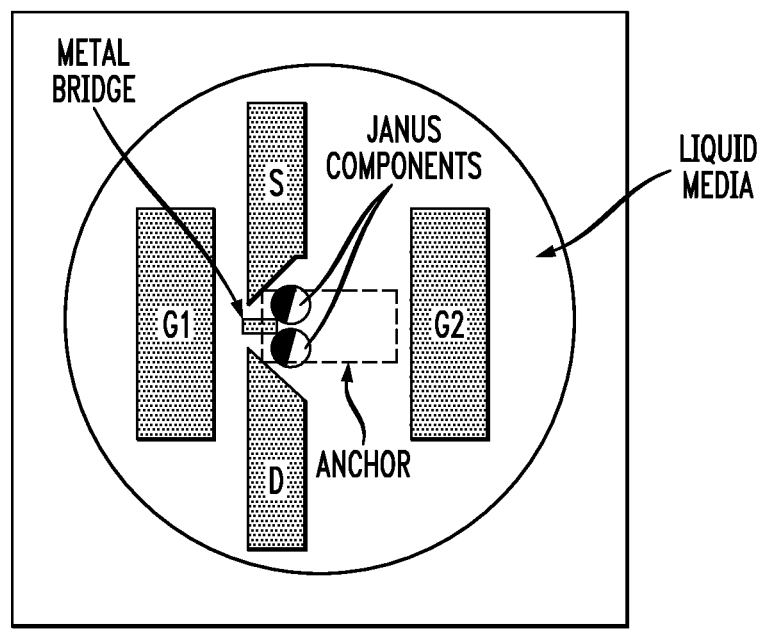
FIG. 11 is a diagram illustrating an exemplary configuration of the present transistor device having multiple Janus components in series according to an embodiment of the present invention.

FIGS. 7-9 schematically illustrate operation of the present Janus component-based transistor devices. Specifically, FIG. 7 illustrates operation of the Janus component-based transistor devices when the Janus component is a spherical Janus particle (such as the Janus particle shown illustrated in FIG. 1A). As described above, switching of the device when the Janus component is a Janus particle occurs by rotating (and also potentially translating) the particle. In this exemplary embodiment, a single Janus component is being shown for illustrative purposes. However, as described above, multiple Janus components may be employed in a given transistor. A multi-component transistor is shown in FIG. 11, described below.

As described above, a fixed charge is created on the surface of the metal portion of the Janus particles. In the example shown in FIG. 7, it is assumed that a fixed negative charge has been created on the surface of the metal portion of the Janus particles. This is merely an example. Should, as described above, a fixed positive charge be created on the surface of the metal portion of the Janus component, then the gate biases would be opposite to what is shown in FIG. 7. As shown in FIG. 7, with a negative gate voltage applied to the gate electrode G1 and a positive gate voltage applied to gate electrode G2, the (exemplary) negatively charged surface of the Janus particle is attracted to the gate electrode G2 thus positioning the electrically insulating portion of the Janus component between the source S and drain D electrodes (i.e., the electrically conductive portion of the Janus component is away from the source S and drain D electrodes). Thus, there is no electrical continuity between the source and drain electrodes.

By applying the opposite gate bias (i.e., applying a positive gate voltage to the gate electrode G1 and a negative gate voltage to gate electrode G2) the (exemplary) negatively charged surface of the Janus particle is now attracted to the gate electrode G1. As a result, as shown in FIG. 7, the Janus particle moves, i.e., rotates to position the (metal) electrically conductive portion of the Janus component between the source S and drain D electrodes, acting as a bridge between the source and drain electrodes. Since the Janus particle can move within the anchor trench, switching the device in this manner may also cause some translation of the Janus particle when the gate bias is switched. Thus, there might be some translation of the Janus particle in addition to rotation (however rotation of the Janus particle is needed to switch the device). Further, as highlighted above, when the gate electrical field is removed from the device, the orientation of the Janus component will remain the same. Namely, a gate bias in the opposite direction is needed to switch the device back. Therefore, the present devices can serve as non-volatile memory cells. Thus, with the configuration shown on the left side of FIG. 7, the transistor device is in an 'off' state and will remain in the off state—even if power to the gates is removed, until the opposite gate bias is applied (as per the configuration shown on the right side of FIG. 7) when the device will switch to an 'on' state.

FIG. 8 illustrates operation of the Janus component-based transistor devices when the Janus component is a Janus cylinder (such as the Janus cylinder shown illustrated in FIG. 1B—having a metal along one (electrically conductive) portion of its length). As described above, switching of the device when the Janus component is a Janus cylinder having a metal along one (electrically conductive) portion of its length occurs by translating the cylinder. In this exemplary embodiment, a single Janus component is being shown for illustrative purposes. However, as described above, multiple Janus components may be employed in a given transistor. A multi-component transistor is shown in FIG. 11, described below.

As described above, a fixed charge is created on the surface of the metal portion of the Janus cylinder. In the example shown in FIG. 8, it is assumed that a fixed negative charge has been created on the surface of the metal portion of the Janus cylinders. This is merely an example. Should, as described above, a fixed positive charge be created on the surface of the metal portion of the Janus component, then the gate biases would be opposite to what is shown in FIG. 8. As shown in FIG. 8, with a negative gate voltage applied to the gate electrode G1 and a positive gate voltage applied to gate electrode G2, the (exemplary) negatively charged surface of the Janus cylinder is attracted to the gate electrode G2. This causes the Janus cylinder to slide within the anchor trench toward the electrode G2 (i.e., placing the electrically conductive portion of the Janus component away from the source S and drain D electrodes). In this state, there is no electrical continuity between the source and drain electrodes.

By applying the opposite gate bias (i.e., applying a positive gate voltage to the gate electrode G1 and a negative gate voltage to gate electrode G2) the (exemplary) negatively charged surface of the Janus cylinder is now attracted to the gate electrode G1. As a result, as shown in FIG. 8, this causes the Janus cylinder to move, i.e., to slide within the anchor trench toward the electrode G1 positioning the (metal) electrically conductive portion of the Janus component between the source S and drain D electrodes, acting as a bridge between the source and drain electrodes. Further, as highlighted above, when the gate electrical field is removed from the device, the orientation of the Janus component will remain the same. Namely, a gate bias in the opposite direction is needed to switch the device back. Therefore, the present devices can serve as non-volatile memory cells. Thus, with the configuration shown on the left side of FIG. 8, the transistor device is in an 'off' state and will remain in the off state—even if power to the gates is removed, until the opposite gate bias is applied (as per the configuration shown on the right side of FIG. 8) when the device will switch to an 'on' state.

FIG. 9 illustrates operation of the Janus component-based transistor devices when the Janus component is a Janus cylinder (such as the Janus cylinder shown illustrated in FIG. 1C—having a metal along (the entire length of) one side of the cylinder). As described above, switching of the device when the Janus component is a Janus cylinder having a metal along (the entire length of) one side of the cylinder occurs by rotating (and also possibly translating) the cylinder. In this exemplary embodiment, a single Janus component is being shown for illustrative purposes. However, as described above, multiple Janus components may be employed in a given transistor. A multi-component transistor is shown in FIG. 11, described below.

As described above, a fixed charge is created on the surface of the metal portion of the Janus cylinders. In the example shown in FIG. 9, it is assumed that a fixed negative charge has been created on the surface of the metal portion of the Janus cylinders. This is merely an example. Should, as described above, a fixed positive charge be created on the surface of the metal portion of the Janus component, then the gate biases would be opposite to what is shown in FIG. 9. As shown in FIG. 9, with a negative gate voltage applied to the gate electrode G1 and a positive gate voltage applied to gate electrode G2, the (exemplary) negatively charged surface of the Janus cylinder is attracted to the gate electrode G2 thus positioning the electrically insulating portion of the Janus component between the source S and drain D electrodes (i.e., the electrically conductive portion of the Janus component is away from the source S and drain D electrodes). Thus, there is no electrical continuity between the source and drain electrodes.

By applying the opposite gate bias (i.e., applying a positive gate voltage to the gate electrode G1 and a negative gate voltage to gate electrode G2) the (exemplary) negatively charged surface of the Janus cylinder is now attracted to the gate electrode G1. As a result, as shown in FIG. 9, the Janus cylinder moves, i.e., rotates to position the (metal) electrically conductive portion of the Janus component between the source S and drain D electrodes, acting as a bridge between the source and drain electrodes. Since the Janus cylinder can move within the anchor trench, switching the device in this manner may also cause some translation of the Janus cylinder when the gate bias is switched. Thus, there might be some translation of the Janus cylinder in addition to rotation (however rotation of the Janus cylinder is needed to switch the device). Further, as highlighted above, when the gate electrical field is removed from the device, the orientation of the Janus component will remain the same. Namely, a gate bias in the opposite direction is needed to switch the device back. Therefore, the present devices can serve as non-volatile memory cells. Thus, with the configuration shown on the left side of FIG. 9, the transistor device is in an 'off' state and will remain in the off state—even if power to the gates is removed, until the opposite gate bias is applied (as per the configuration shown on the right side of FIG. 9) when the device will switch to an 'on' state.

Figure 10:
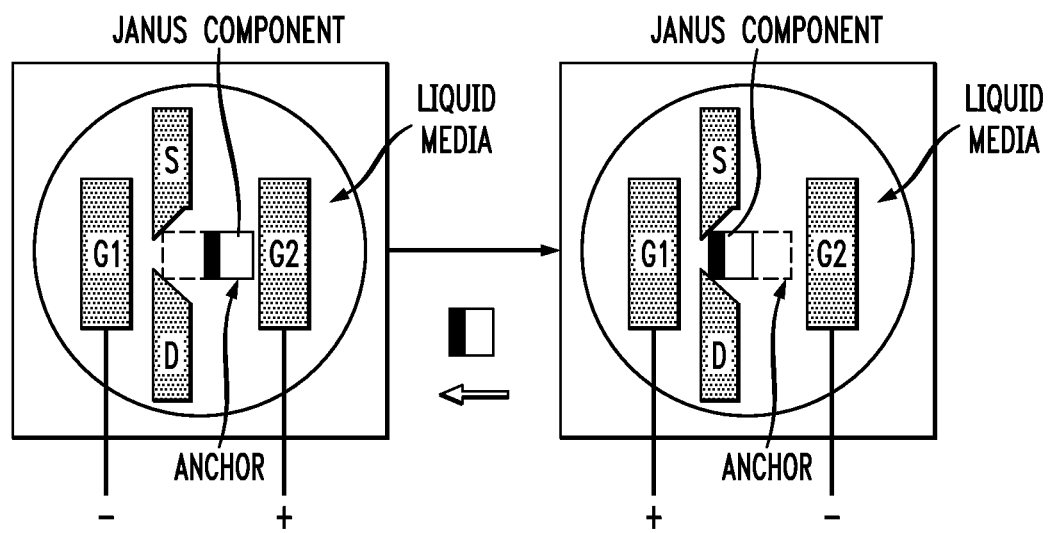
FIG. 10 is a diagram illustrating operation of the present Janus component based transistor device when the Janus component is a Janus prism (such as that shown in FIG. 1D) according to an embodiment of the present invention.

FIG. 10 illustrates operation of the Janus component-based transistor devices when the Janus component is a Janus prism (such as the Janus prism shown illustrated in FIG. 1D). As described above, switching of the device when the Janus component is a Janus prism occurs by translating the prism. In this exemplary embodiment, a single Janus component is being shown for illustrative purposes. However, as described above, multiple Janus components may be employed in a given transistor. A multi-component transistor is shown in FIG. 11, described below.

As described above, a fixed charge is created on the surface of the metal portion of the Janus prism. In the example shown in FIG. 10, it is assumed that a fixed negative charge has been created on the surface of the metal portion of the Janus prisms. This is merely an example. Should, as described above, a fixed positive charge be created on the surface of the metal portion of the Janus component, then the gate biases would be opposite to what is shown in FIG. 10. As shown in FIG. 10, with a negative gate voltage applied to the gate electrode G1 and a positive gate voltage applied to gate electrode G2, the (exemplary) negatively charged surface of the Janus prism is attracted to the gate electrode G2. This causes the Janus prism to slide within the anchor trench toward the electrode G2 (i.e., placing the electrically conductive portion of the Janus component away from the source S and drain D electrodes). In this state, there is no electrical continuity between the source and drain electrodes.

By applying the opposite gate bias (i.e., applying a positive gate voltage to the gate electrode G1 and a negative gate voltage to gate electrode G2) the (exemplary) negatively charged surface of the Janus prism is now attracted to the gate electrode G1. As a result, as shown in FIG. 10, this causes the Janus prism to move, i.e., to slide within the anchor trench toward the electrode G1 positioning the (metal) electrically conductive portion of the Janus component between the source S and drain D electrodes, acting as a bridge between the source and drain electrodes. Further, as highlighted above, when the gate electrical field is removed from the device, the orientation of the Janus component will remain the same. Namely, a gate bias in the opposite direction is needed to switch the device back. Therefore, the present devices can serve as non-volatile memory cells. Thus, with the configuration shown on the left side of FIG. 10, the transistor device is in an 'off' state and will remain in the off state—even if power to the gates is removed, until the opposite gate bias is applied (as per the configuration shown on the right side of FIG. 10) when the device will switch to an 'on' state.

As provided above, the present transistor devices can employ multiple Janus components which function in the same manner as a single component (as shown in the exemplary embodiments described above). According to an exemplary embodiment, the multiple Janus components are employed either in series or in parallel. An exemplary multi-component device is shown in FIG. 11 wherein the Janus components are used in series. It is notable that the Janus components in the example shown in FIG. 11 are spherical Janus particles, however, the same principles apply to any of the Janus component shapes described herein. Further, FIG. 11 illustrates two Janus particles being used, but that is merely exemplary. More than two Janus components may be employed in the same manner shown. By way of example only, in one non-limiting example, up to 10 Janus components (e.g., from 1 to 3 Janus components) are placed in series in the device. As shown in FIG. 11, the metal portions of the Janus components (the surfaces of which as described above are functionalized with a fixed charge) self-align with the gate bias, such that (as provided above) when a certain gate bias is provided, the Janus components will rotate into position forming a bridge (electrical continuity) between the source and drain electrodes.

Due to the shape of the (spherical) Janus particles shown in FIG. 11, it may be desirable to form a metal bridge in between the source and drain electrodes to ensure that continuity (when desired—i.e., based on switching of the device, see above) will be achieved between the particles. Specifically, due to the spherical shape of the particles, the amount of surface area available for contact between the particles is small. The metal bridge increases this contact area. While only one metal bridge is shown in FIG. 11, it is to be understood that multiple metal bridges may be employed to 'bridge' the gap between Janus particles—depending on how many Janus particles are present with one bridge being present between each pair of particles. For instance, if three Janus particles were employed in series, then two metal bridges would preferably be employed. According to an exemplary embodiment, the metal bridge(s) is/are formed (from Cu) at the same time as the formation of the source, drain and gate electrodes, for example, using conventional metal plating and lift-off techniques.

As described above, the spherical shape of the Janus particles limits the contact area between particles (in the case of multiple particles in series), thus making use of a metal bridge (as shown in FIG. 11) preferable. By contrast, when the Janus components are cylindrical or prism-shaped, then the use of a metal bridge is likely unnecessary.

Figure 12:
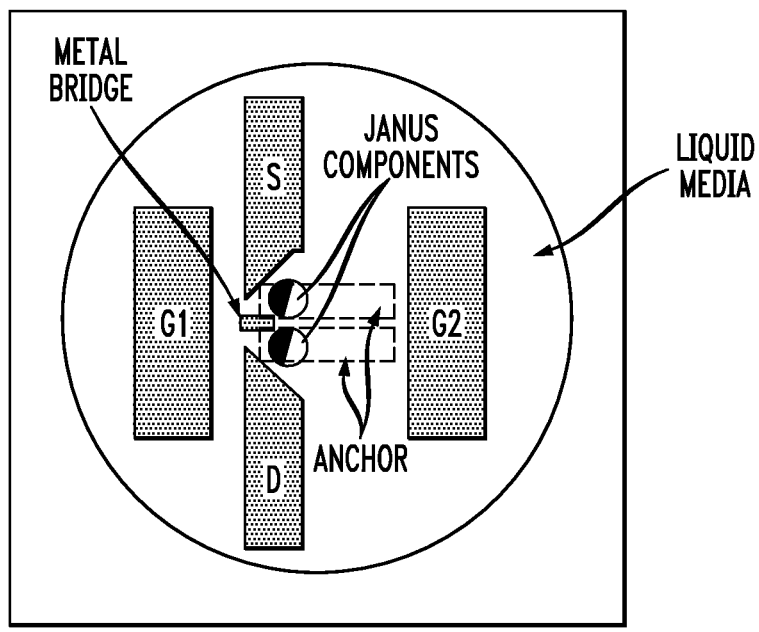
FIG. 12 is a diagram illustrating an exemplary configuration of the present transistor device having multiple Janus components in series with multiple anchor trenches according to an embodiment of the present invention.

In FIG. 11 the multiple Janus components (in series) are anchored using one anchor trench. According to another exemplary embodiment, multiple anchor trenches are employed wherein each anchor trench anchors at least one Janus component. See FIG. 12. The functioning of the device shown in FIG. 12 is the same as that shown in FIG. 11 and described above. It is notable that a metal bridge is also employed in this embodiment. As described above, the use of a metal bridge would likely be unnecessary if the Janus components were instead cylindrical or prism shaped.

As described above, with the multiple Janus component embodiments the components may be employed in series (see, for example, FIGS. 11 and 12) or in parallel. A parallel configuration provides redundancy of the device and thus extra security in case one of the Janus components is faulty. For instance, a defect in one Janus component would affect the device when the components are arranged in series, but not so when the components are in parallel. Namely, as will be described in detail below, when the Janus components are present in parallel (for example in a stacked configuration) multiple components make contact with the source and drain electrodes when the device is switched. That insures that if one of the Janus components is faulty then continuity can still occur via the other component in parallel.

FIG. 13 is a diagram illustrating an exemplary multi-component device wherein the Janus components are used in parallel. It is notable that FIGS. 13 and 14 are depictions of cross-sectional cuts through the device, through the anchor trench (e.g., along line A1-A2—see FIG. 6). In this exemplary configuration, the anchor trench has a greater depth d than in the other embodiments shown and described above. The depth of the trench is dependent on the particular type and shape of the Janus components being employed. Exemplary dimensions for the various types of Janus components were provided above. By way of example only, in one non-limiting example, up to 10 Janus components (e.g., from 1 to 3 Janus components) are placed in series in the device. In the example shown in FIG. 13, 4 Janus components (in this case (spherical) Janus particles) are employed in parallel. It is apparent from FIG. 13 that the Janus components are physically constrained within the anchor trench, and will self align as a stack when deposited into the trench (in the same mariner as described above). The switching operation of the device is the same as the single component embodiment (see for instance FIG. 7), except that in FIG. 13 the components are rotated (and potentially translated—see above) together as a stack. Otherwise the operation is identical between the single- and multi-component configurations.

For completeness of description, a multi-component is shown in FIG. 14 where the Janus components (also self-oriented in a stack)—in this case Janus prisms, are translated as a stack to switch the device. Thus the switching operation of the device is the same as the single component embodiment (see for instance FIG. 10), except that in FIG. 14 the components are translated together as a stack. Otherwise the operation is identical between the single- and multi-component configurations. By way of FIGS. 13 and 14 both scenarios involving either rotation or translation, respectively, of multiple Janus component device configurations are shown. Any other Janus component shapes would operate in the same manner. For instance, when the Janus component is a cylinder configured as shown in FIG. 1C, then the multi-component embodiment would function such as is shown in FIG. 13. When the Janus component is a cylinder configured as shown in FIG. 1B, then the multi-component embodiment would function such as is shown in FIG. 14.

As provided above, one or more surfaces of the Janus components (and also potentially the surfaces of the source and drain electrodes) may be functionalized according to the present techniques with fixed (positive or negative) charges. FIG. 15 is a diagram illustrating exemplary chemistry for functionalization of these surfaces. As provided above, the same charged functional groups (i.e., positively or negatively charged groups) may be employed in functionalizing the Janus components, the source and drain electrodes, etc. However, a thiol will be used to anchor the molecule onto a metal surface (such as the metal portion of the Janus components, the source and drain electrodes, etc.) whereas a hydroxamic group will be used to anchor the molecule onto a dielectric (oxide, nitride, etc.) surface (such as the dielectric portion of the Janus components). See FIG. 15.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating an electromechanical transistor, the method comprising the steps of:
   providing a wafer;
   forming a source electrode and a drain electrode opposite one another on a surface of the wafer, wherein a gap is present between the source electrode and the drain electrode;
   forming a first gate electrode and a second gate electrode on the surface of the wafer on opposite sides of the gap between the source electrode and the drain electrode; and
   placing at least one Janus component in the gap between the source electrode and the drain electrode, wherein the Janus component includes a first portion comprising an electrically conductive material and a second portion comprising an electrically insulating material.

2. The method of claim 1, wherein the source electrode and the drain electrode are formed opposite one another in a first direction along the surface of the wafer, and wherein the first gate electrode and the second gate electrode are formed opposite one another in a second direction along the surface of the wafer, wherein the first direction is perpendicular to the second direction.

3. The method of claim 1, wherein the wafer comprises a dielectric layer and wherein the source electrode, the drain electrode, the first gate electrode and the second gate electrode are formed on the dielectric layer.

4. The method of claim 1, wherein the source electrode, the drain electrode, the first gate electrode and the second gate electrode are formed from copper.

5. The method of claim 1, wherein the electrically conductive material is a metal.

6. The method of claim 5, wherein the metal is selected from a group consisting of: gold, copper, aluminum, silver, palladium.

7. The method of claim 1, wherein the electrically insulating material is a dielectric material.

8. The method of claim 1, further comprising the step of:
   functionalizing a surface of the first portion of the Janus component that comprises the electrically conductive material with a fixed charge.

9. The method of claim 8, further comprising the step of:
   functionalizing a surface of the second portion of the Janus component that comprises the electrically insulating material with a fixed charge that has an opposite polarity to the fixed charge functionalizing the surface of the first portion of the Janus component that comprises the electrically conductive material.

10. The method of claim 1, further comprising the step of:
    forming an anchor trench in the surface of the wafer in the gap between the source electrode and the drain electrode.

11. The method of claim 1, wherein the anchor trench is formed using reactive ion etching.

12. The method of claim 1, further comprising the step of:
    functionalizing one or more surfaces of the source electrode and one or more surfaces of the drain electrode.

13. The method of claim 12, wherein the one or more surfaces of the source electrode and the one or more surfaces of the drain electrode are functionalized with a fixed charge.

14. The method of claim 1, wherein the step of placing the Janus component in the gap between the source electrode and the drain electrode comprises the step of:
    soaking the wafer in a solution comprising the Janus component.

15. The method of claim 14, further comprising the step of:
    applying an electrical field between the first gate electrode and the second gate electrode while the wafer is soaked in the solution comprising the Janus component.

16. The method of claim 1, wherein the step of placing the Janus component in the gap between the source electrode and the drain electrode comprises the steps of:
    forming a mask over the wafer; and
    depositing the Janus component in the gap between the source electrode and the drain electrode through the mask.

17. The method of claim 1, wherein the Janus component comprises a Janus particle.

18. The method of claim 17, wherein the Janus particle has a diameter of from about 20 nm to about 20 μm.

19. The method of claim 1, wherein the Janus component comprises a Janus cylinder.

20. The method of claim 19, wherein the Janus cylinder has a length of from about 20 nm to about 100 μm.

21. The method of claim 1, wherein the Janus component comprises a Janus prism.

22. The method of claim 21, wherein the Janus prism has a length of from about 20 nm to about 20 μm, a width of from about 20 nm to about 20 μm and a height of from about 20 nm to about 20 μm.

* * * * *